(12) United States Patent
Jo et al.

(10) Patent No.: US 10,181,499 B2
(45) Date of Patent: Jan. 15, 2019

(54) ORGANIC LIGHT EMITTING DISPLAY DEVICE

(71) Applicant: LG DISPLAY CO., LTD., Seoul (KR)

(72) Inventors: JungGeun Jo, Yangpyeong-gun (KR);
JungHyun Ham, Paju-si (KR);
YoungSun Seo, Goyang-si (KR);
SeonMee Lee, Cheorwon-gun (KR);
YuHoon Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/361,886

(22) Filed: Nov. 28, 2016

(65) Prior Publication Data

US 2017/0294491 A1 Oct. 12, 2017

(30) Foreign Application Priority Data

Apr. 8, 2016 (KR) .......................... 10-2016-0043747
Jul. 29, 2016 (KR) .......................... 10-2016-0097562

(51) Int. Cl.
| | | |
|---|---|---|
| H01L 27/32 | (2006.01) | |
| G09G 3/20 | (2006.01) | |
| G09G 3/32 | (2016.01) | |
| G09G 3/3225 | (2016.01) | |

(52) U.S. Cl.
CPC ....... H01L 27/3218 (2013.01); G09G 3/2003 (2013.01); G09G 3/3225 (2013.01); H01L 27/3276 (2013.01); *G02F 2201/52* (2013.01); *G09G 2300/0452* (2013.01); *H01L 27/3216* (2013.01)

(58) Field of Classification Search
CPC ............. H01L 27/3218; H01L 27/3216; H01L 27/3276; G09G 3/2003; G09G 3/3225
See application file for complete search history.

(56) References Cited

U.S. PATENT DOCUMENTS

| | | | | |
|---|---|---|---|---|
| 7,030,553 | B2* | 4/2006 | Winters | H01L 27/3213 |
| | | | | 313/113 |
| 7,030,554 | B2* | 4/2006 | Liao | H01L 27/3211 |
| | | | | 313/504 |
| 7,324,707 | B2* | 1/2008 | Huang | G06T 3/4015 |
| | | | | 348/E9.01 |
| 7,417,648 | B2 | 8/2008 | Credelle | |
| 7,443,093 | B2 | 10/2008 | Jianpu et al. | |
| 7,593,047 | B2* | 9/2009 | Funakoshi | H04N 5/335 |
| | | | | 348/273 |
| 7,714,916 | B2* | 5/2010 | Tatani | H04N 9/045 |
| | | | | 348/272 |

(Continued)

FOREIGN PATENT DOCUMENTS

| | | |
|---|---|---|
| CN | 204885166 U | 12/2015 |
| CN | 204885167 U | 12/2015 |

(Continued)

*Primary Examiner* — Ida M Soward
(74) *Attorney, Agent, or Firm* — Birch, Stewart, Kolasch & Birch, LLP

(57) ABSTRACT

Discussed in an organic light emitting display device including a first pixel, and a second pixel being adjacent the first pixel, wherein each of the first pixel and the second pixel includes a plurality of subpixels, wherein the plurality of subpixels include a green subpixel, a red subpixel, and a blue subpixel, and wherein the red subpixel and the blue subpixel are shared by the first pixel and the second pixel.

25 Claims, 11 Drawing Sheets

(56) References Cited

U.S. PATENT DOCUMENTS

| | | | |
|---|---|---|---|
| 7,994,712 B2* | 8/2011 | Sung | H01L 51/5265 |
| | | | 313/504 |
| 8,159,117 B2 | 4/2012 | Karaki et al. | |
| 8,253,323 B2 | 8/2012 | Sung et al. | |
| 8,330,352 B2 | 12/2012 | Sung et al. | |
| 8,338,832 B2 | 12/2012 | Kim | |
| 8,344,306 B2* | 1/2013 | Kim | H04N 3/155 |
| | | | 250/208.1 |
| 8,552,635 B2 | 10/2013 | Kim et al. | |
| 8,716,929 B2 | 5/2014 | Yoo et al. | |
| 8,730,360 B2* | 5/2014 | Tanaka | G06T 3/4015 |
| | | | 348/280 |
| 8,754,913 B2 | 6/2014 | Hwang et al. | |
| 8,913,165 B2* | 12/2014 | Okigawa | H01L 27/14621 |
| | | | 348/280 |
| 8,994,015 B2 | 3/2015 | Pyon et al. | |
| 9,041,625 B2 | 5/2015 | Hwang et al. | |
| 9,307,584 B2 | 4/2016 | Ko | |
| 9,318,537 B2 | 4/2016 | Sung et al. | |
| 9,324,262 B2 | 4/2016 | Kim et al. | |
| 9,337,241 B2* | 5/2016 | Lee | H01L 27/3218 |
| 9,508,296 B2* | 11/2016 | Guo | G09G 3/3607 |
| 9,531,976 B2* | 12/2016 | Korobov | H04N 5/37452 |
| 9,536,464 B2* | 1/2017 | Guo | G09G 3/32 |
| 9,710,885 B2* | 7/2017 | Lee | G06T 3/4015 |
| 9,727,966 B2* | 8/2017 | Suh | G01B 11/22 |
| 9,786,210 B2* | 10/2017 | Feng | G09G 3/2003 |
| 9,887,247 B2* | 2/2018 | Yang | H01L 27/3218 |
| 2005/0110398 A1 | 5/2005 | Lee | |
| 2008/0043045 A1* | 2/2008 | Natori | G09F 9/33 |
| | | | 345/690 |
| 2008/0205792 A1* | 8/2008 | Andersen | G06T 3/4015 |
| | | | 382/299 |
| 2010/0090620 A1* | 4/2010 | Hack | H01L 27/3213 |
| | | | 315/312 |
| 2011/0019051 A1* | 1/2011 | Yin | H04N 5/347 |
| | | | 348/311 |
| 2011/0025723 A1 | 2/2011 | Kim | |
| 2011/0140999 A1* | 6/2011 | Beland | G06F 3/1446 |
| | | | 345/82 |
| 2013/0063421 A1* | 3/2013 | Yoon | G02B 27/2214 |
| | | | 345/419 |
| 2013/0234917 A1 | 9/2013 | Lee | |
| 2014/0071030 A1 | 3/2014 | Lee | |
| 2015/0015466 A1 | 1/2015 | Feng | |
| 2015/0363913 A1* | 12/2015 | Higgins | G06T 3/4015 |
| | | | 382/164 |
| 2015/0364525 A1* | 12/2015 | Lin | H01L 27/3213 |
| | | | 257/40 |
| 2015/0364526 A1 | 12/2015 | Peng et al. | |
| 2016/0057817 A9 | 2/2016 | Ko | |
| 2016/0171651 A1* | 6/2016 | Lee | G06T 3/4015 |
| | | | 382/300 |
| 2016/0197123 A1 | 7/2016 | Sung et al. | |
| 2016/0197125 A1 | 7/2016 | Ko | |
| 2016/0217726 A1* | 7/2016 | Guo | G09G 3/2003 |
| 2016/0233273 A1* | 8/2016 | Ohyama | G02B 5/3083 |
| 2016/0240593 A1* | 8/2016 | Gu | G09G 3/3225 |
| 2016/0254327 A1* | 9/2016 | Bai | H01L 27/12 |
| | | | 257/40 |
| 2016/0322432 A1* | 11/2016 | Yang | H01L 27/3218 |
| 2016/0357076 A1* | 12/2016 | Huangfu | G02F 1/134336 |
| 2017/0148368 A1* | 5/2017 | Won | G09G 3/2092 |
| 2018/0109742 A1* | 4/2018 | Agranov | H04N 5/347 |

FOREIGN PATENT DOCUMENTS

| | | | |
|---|---|---|---|
| CN | 105552102 A | * | 5/2016 |
| JP | 2008-209902 A | | 9/2008 |
| JP | 2012-28170 A | | 2/2012 |
| KR | 10-0560789 B1 | | 3/2006 |
| KR | 10-0729077 B1 | | 6/2007 |
| KR | 10-2008-0035774 A | | 4/2008 |
| KR | 10-2009-0049515 A | | 5/2009 |
| KR | 10-2010-0001598 A | | 1/2010 |
| KR | 10-2011-0013691 A | | 2/2011 |
| KR | 10-1066411 B1 | | 9/2011 |
| KR | 10-2011-0117612 A | | 10/2011 |
| KR | 10-2011-0117613 A | | 10/2011 |
| KR | 10-2011-0129531 A | | 12/2011 |
| KR | 10-2012-0020087 A | | 3/2012 |
| KR | 10-2013-0007309 A | | 1/2013 |
| KR | 10-2013-0025741 A | | 3/2013 |
| KR | 10-2013-0101874 A | | 9/2013 |
| KR | 10-2014-0020120 A | | 2/2014 |
| KR | 10-2014-0111505 A | | 9/2014 |
| KR | 10-2015-0007261 A | | 1/2015 |
| KR | 10-2015-0007992 A | | 1/2015 |
| KR | 10-2015-0107883 A | | 9/2015 |
| KR | 10-2015-0122564 A | | 11/2015 |
| KR | 10-2016-0018936 A | | 2/2016 |
| KR | 10-2016-0019243 A | | 2/2016 |
| KR | 10-2016-0029376 A | | 3/2016 |
| WO | WO 02/091349 A1 | | 11/2002 |

* cited by examiner

ORGANIC LIGHT EMITTING DISPLAY DEVICE

CROSS-REFERENCE TO RELATED APPLICATIONS

This application claims the priority benefit of Korean Patent Application No. 10-2016-0043747 filed on Apr. 8, 2016 and No. 10-2016-0097562 filed on Jul. 29, 2016, all of which are hereby incorporated by reference as if fully set forth herein.

BACKGROUND OF THE INVENTION

Field of the Invention

The present disclosure relates to an organic light emitting display device, and more particularly, to an organic light emitting display device with an improved cognitive fill factor, minimized lattice defects, and minimized color fringe.

Description of the Related Art

Recently, as society advances to the information society, the field of display devices which visually express electrical information signals is rapidly advancing. Thus, various display devices with performance, such as thinness, lightness, and low power consumption have been developed.

As specific examples of the display devices as described above, there are a liquid crystal display (LCD) device, a plasma display panel (PDP) device, a field emission display (FED) device, and an organic light emitting display (OLED) device.

In particular, the organic light emitting display device attracts much attention as a self-light emitting element since the organic light emitting display device is fast in response time and has excellent light emitting efficiency, high brightness, and a wide viewing angle compared to the other display devices.

In addition, an organic light emitting diode, which is applied to the organic light emitting display device, is a next-generation light source that has self-luminance characteristics and is excellent compared to the liquid crystal in terms of a viewing angle, contrast, a response time, power consumption, and the like. In addition, the organic light emitting element has a surface light emitting structure, and thus may be easily used to implement a flexible display device.

The organic light emitting display device includes plurality of subpixels including red subpixels, green subpixels, and blue subpixels. The red subpixels, the green subpixels, and the blue subpixels emit red light, green light, and blue light, respectively, and a full-color image may be implemented by means of the plurality of subpixels.

Recently, in order to implement a high-resolution image of the organic light emitting display device, research is being actively conducted on pixel structures such as aperture ratios of the subpixels or positions of the subpixels. In general, the subpixels in the organic light emitting display device has a symmetrical structure in which the subpixels are spaced apart from each other at an equal interval in a row direction (horizontal direction) or in a column direction (vertical direction) or the subpixels are disposed alternately and regularly. In particular, recently, an organic light emitting display device is widely used which has a checkerboard pattern structure in which a green subpixel and a blue subpixel are arranged in one pixel, a green subpixel and a red subpixel are arranged in the other pixel, and then each of the pixels are alternately arranged.

However, in this structure, all of the subpixels for three colors, red (R), green (G), and blue (B) are not arranged in a single pixel, and only the red and green subpixels are arranged in the single pixel, or only the blue and green subpixels are arranged in the single pixel, such that two colors are arranged in the single pixel. In this structure, a rendering technique, which controls and uses colors of adjacent pixels in order to generate an image with actual colors, is used. However, in comparison with the structure in which three colors are arranged in the single pixel, in the instance of the structure in which two colors are arranged in the single pixel, intervals between the subpixels are large, and a cognitive fill factor, which is substantially recognized by a user, deteriorates, because all of three colors of light are not emitted.

In addition, in the instance of the organic light emitting display device which has a symmetrical pixel structure or a pixel structure having a checkerboard pattern as described above, there are problems in that lattice defects (artifacts) are visually detected between the subpixels because of the regular arrangement of black matrixes, and there occurs color fringe in which at an edge of a small-sized letter or picture, a single color of the RGB colors is visually detected or an unintended color is visually detected due to a mixture of the RGB colors.

SUMMARY OF THE INVENTION

The inventors of the present disclosure recognized that symmetry and regularity are increased and thus a lattice defect occurs since subpixels in an organic light emitting display device are disposed to have a symmetrical structure or a checkerboard structure, and a cognitive fill factor deteriorates and thus the lattice defect becomes more severe as subpixels having only two colors are arranged in the single pixel. In addition, the inventors of the present disclosure recognized that color fringe occurs since the subpixels are regularly arranged, the subpixel for a particular color is arranged to be biased toward one side in the single pixel, and the subpixels are arranged in accordance with a predetermined scheme or a regular scheme. Accordingly, the inventors of the present disclosure invented an organic light emitting display device in which each of the pixels is configured to share one of the subpixels with the adjacent pixel, the adjacent two pixels are configured to be asymmetrical with respect to each other, and arranged in a pattern in which the adjacent pixels have repeated arrangement in two periods, and as a result, it is possible to improve a cognitive fill factor and minimize a lattice defect and color fringe.

An object to be achieved by the present disclosure is to provide an organic light emitting display device in which a green subpixel is included in a single pixel, and a blue subpixel and a red subpixel, which are shared by adjacent pixels, are partially included in the single pixel, unlike the structure in which two subpixels are included in the single pixel, thereby improving a cognitive fill factor, which is substantially recognized by a user when implementing high resolution, even in a state in which the pixel has the same light emitting area.

Another object to be achieved by the present disclosure is to provide an organic light emitting display device capable of ensuring process characteristics by reducing the physical number of subpixels arranged in the single pixel.

Still another object to be achieved by the present disclosure is to provide an organic light emitting display device in which two subpixels are arranged so as not to be symmetrical with an adjacent column, thereby uniformly distributing each of the subpixels and thus reducing color fringe.

The objects of the present disclosure are not limited to the aforementioned objects, and other objects, which are not mentioned above, will be apparent to a person having ordinary skill in the art from the following description.

According to an aspect of the present disclosure, an organic light emitting display device includes a first pixel and a second pixel being adjacent to each other, and each of the first pixel and the second pixel includes a plurality of subpixels, the plurality of subpixels include a green subpixel, a red subpixel, and a blue subpixel. In this instance, the red subpixel and the blue subpixel are shared by the first pixel and the second pixel. The organic light emitting display device according to the example embodiment of the present disclosure is configured such that the green subpixel is included in the single pixel, and the blue subpixel and the red subpixel, which are shared by the adjacent pixels, are also partially included in the single pixel. As a result, it is possible to improve a cognitive fill factor when implementing high resolution even in a state in which the pixel has the same light emitting area.

According to the organic light emitting display device according to the example embodiment of the present disclosure, two pixel groups which are vertically adjacent to each other, are arranged such that the pixels which are horizontally adjacent to each other are asymmetrical. As a result, it is possible to reduce a lattice defect in which a black lattice is visually detected at a bank layer between the subpixels when light is emitted from the pixel. Further, it is possible to minimize color fringe in which at an edge of an image, colors are blurred or a single color of the RGB colors is visually detected.

According to another aspect of the present disclosure, an organic light emitting display device includes a plurality of pixels, in which one pixel includes a first subpixel, a second subpixel, and a third subpixel which emit light with different colors, one pixel includes at least one first subpixel, and the second subpixel and the third subpixel which are shared with another pixel adjacent to the one pixel, and one pixel and another pixel are vertically symmetrical.

According to another aspect of the present disclosure, an organic light emitting device comprises a plurality of pixels including a first pixel and a second pixel that is adjacent to the first pixel, each of the plurality of pixels including a plurality of subpixels, wherein the first pixel shares at least one of the plurality of subpixels with a first adjacent pixel, and the second pixel shares at least one of the plurality subpixels with a second adjacent pixel, and the first pixel and the second pixel are vertically symmetrical.

According to another aspect of the present disclosure, an organic light emitting device includes subpixel groups including a plurality of subpixels are repeatedly arranged. Each of the subpixel groups includes a first subpixel unit and a second subpixel unit which each include a single blue subpixel, a single red subpixel, and two green subpixels, the two green subpixels of the first subpixel unit are arranged to be spaced apart in different directions with respect to a first extended line that runs through centers of the blue subpixel and the red subpixel of the first subpixel unit, and the two green subpixels of the second subpixel unit are arranged to be spaced apart in the same direction with respect to a second extended line that runs through centers of the blue subpixel and the red subpixel of the second subpixel unit.

Details of other example embodiments will be included in the detailed description of the disclosure and the accompanying drawings.

According to the present disclosure, the organic light emitting display device according to the example embodiment of the present disclosure is configured such that the green subpixel is included in the single pixel, and the blue subpixel and the red subpixel, which are shared by the adjacent pixels, are also partially included in the single pixel. As a result, it is possible to improve a cognitive fill factor when implementing high resolution even in a state in which the pixel has the same light emitting area.

According to the present disclosure, two pixel groups which are vertically adjacent to each other are arranged such that the pixels which are horizontally adjacent to each other are asymmetrical. As a result, it is possible to reduce a lattice defect in which a black lattice is visually detected at a bank layer between the subpixels when light is emitted from the pixel. Further, it is possible to minimize color fringe in which at an edge of an image, colors are blurred or a single color of the RGB colors is visually detected.

According to the present disclosure, the green subpixel, the blue subpixel, and the red subpixel are arranged in the single pixel, and the blue subpixel and the red subpixel are differently arranged for each column. As a result, it is possible to improve a cognitive fill factor.

According to the present disclosure, the physical number of subpixels arranged in the single pixel is reduced, and as a result, it is possible to improve efficiency of the manufacturing process and emit all of red light, green light, and blue light from the single pixel.

According to the present disclosure, the two pixel groups, which share the blue subpixel and the red subpixel and are vertically adjacent to each other, are alternately arranged to have repeated arrangement in two periods so as not to be symmetrical with respect to the pixels horizontally adjacent to each other, thereby uniformly distributing each of the subpixels and thus reducing a color fringe.

According to the present disclosure, the green subpixel is included in the single pixel, and the blue subpixel and the red subpixel, which are shared by the adjacent pixels, are partially included in the single pixel. Further, two pixel groups, which are vertically adjacent to each other, are arranged such that the pixels, which are horizontally adjacent to each other, are asymmetrical. As a result, it is possible to minimize a lattice defect and color fringe due to the regular arrangement of the subpixels.

According to the present disclosure, the two pixel groups, which share the blue subpixel and the red subpixel and are vertically adjacent to each other, and the pixels, which are adjacent to the left and right sides of the two pixel groups, are arranged to be asymmetrical. As a result, it is possible to minimize a lattice defect and color fringe in which a black lattice is visually detected at the bank layer between the subpixels when light is emitted from the pixel.

According to the present disclosure, since the subpixels have symmetry, stress applied to the opening region of the FMM during a deposition process using the FMM may be dispersed. As a result, it is possible to minimize a defect of the subpixel which is caused when light emitting regions of the subpixels overlap each other because of a non-uniform stress applied to the opening region of the FMM, which is caused by a difference of tensile force of the FMM that may be generated during the deposition process using the FMM. In addition, since deformation of the FMM may be minimized, precision of the process of depositing the organic light emitting layer may be improved.

According to the present disclosure, the subpixels are configured to have a shape having asymmetry, and as a result, in an intance in which an interval between the opening regions of the FMM is small, it is possible to minimize a phenomenon in which the FMM is sagged or curved by gravity during the deposition process using the mask.

The effects of the present disclosure are not limited to the aforementioned effects, and various other effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1A:
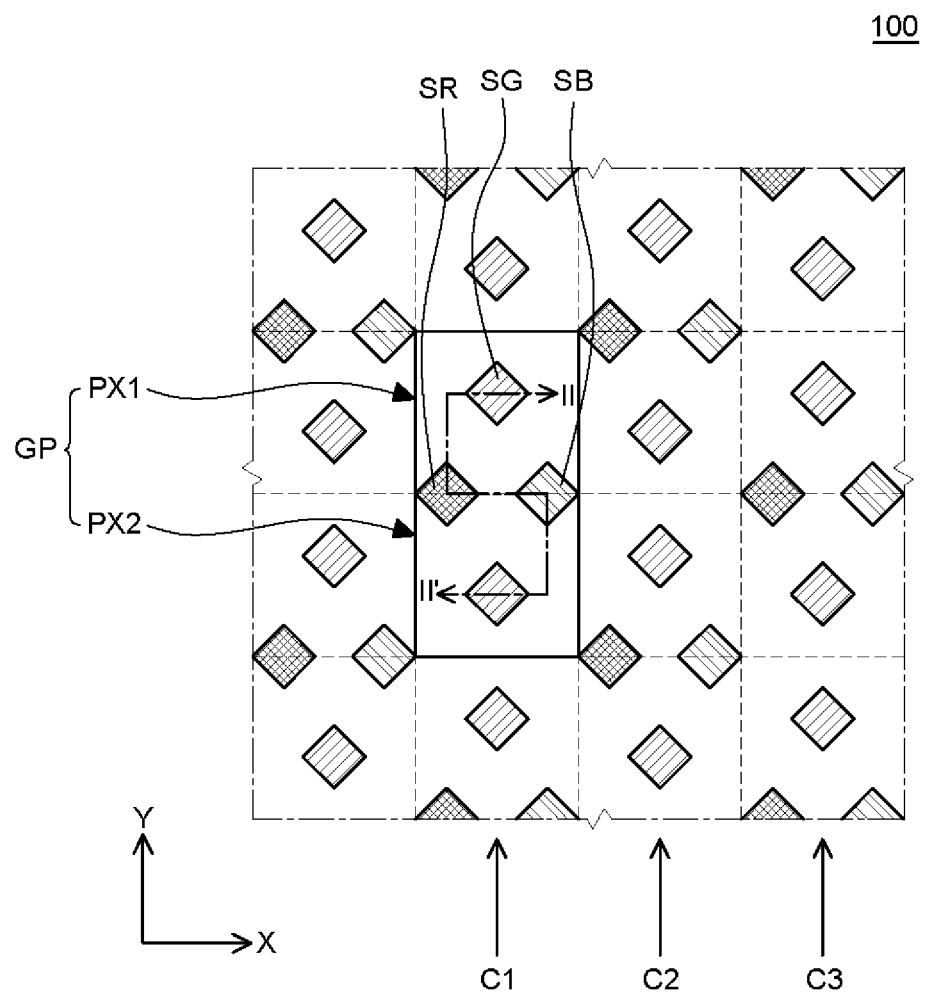
FIGS. 1A and 1B are schematic top plan views for explaining an organic light emitting display device according to an example embodiment of the present disclosure.

Advantages and features of the present disclosure, and methods for accomplishing the same will be more clearly understood from example embodiments described below with reference to the accompanying drawings. However, the present disclosure is not limited to the following example embodiments but may be implemented in various different forms. The example embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the example embodiments of the present disclosure are merely examples, and the present disclosure is not limited thereto. Same reference numerals generally denote same elements throughout the present specification. Further, in the following description, a detailed explanation of known related technologies may be omitted to avoid unnecessarily obscuring the subject matter of the present disclosure. The terms such as "including," "comprising," and "having" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways, and the embodiments can be carried out independently of or in association with each other.

Hereinafter, various example embodiments of the present disclosure will be described in detail with reference to the accompanying drawings.

FIG. 1A is a schematic top plan view for explaining an organic light emitting display device according to an example embodiment of the present disclosure. FIG. 1A schematically illustrates only an arrangement structure in which some pixels and some subpixels, which constitute the organic light emitting display device, are arranged.

Referring to FIG. 1A, an organic light emitting display device 100 includes a plurality of pixels. The plurality of pixels includes a plurality of subpixels, respectively. The subpixel is an element for displaying a single color, and includes a light emitting region from which light is emitted, and a non-light emitting region from which no light is emitted, but in the present specification, only the region from which light is emitted is defined as the subpixel. In FIG. 1A, the hatched region refers to the subpixel. The subpixels display particular colors in the organic light emitting display device 100. For example, the subpixels include a red subpixel SR, a green subpixel SG and a blue subpixel SB, and emit red light, green light, and blue light, respectively. However, the subpixels of the organic light emitting display device 100 are not limited thereto, and the organic light emitting display device 100 may further include a white subpixel in addition to the green subpixel SG, the red subpixel SR, and the blue subpixel SB.

Referring to FIG. 1A, one of the pixels of the organic light emitting display device 100 includes the single green subpixel SG, and shares the red subpixel SR and the blue subpixel SB with the other pixel positioned adjacent to one pixel in a column direction (Y-axis direction). In detail, the first pixel PX1 includes the single green subpixel SG that is non-shared, and shares the red subpixel SR and the blue subpixel SB, at a lower side thereof, with the second pixel PX2 adjacent to the first pixel PX1. In addition, like the first pixel PX1, the second pixel PX2 includes the single green subpixel SG, and shares the red subpixel SR and the blue subpixel SB with the first pixel PX1. The red subpixel SR and the blue subpixel SB may be shared in a vertical direction, or may be shared in a horizontal direction. And, the subpixels, which are shared by the first pixel PX1 and the second pixel PX2, are not necessarily limited to the blue subpixel SB and the red subpixel SR, and the subpixels, which are shared by the first pixel PX1 and the second pixel PX2, may be the green subpixel SG and the red subpixel SR, or the green subpixel SG and the blue subpixel SB in accordance with a design. Further, the red subpixel SR and the blue subpixel SB may be disposed in the same line.

In this instance, the red subpixel SR and the blue subpixel SB, which are shared by the first pixel PX1 and the second pixel PX2, may be positioned on a boundary line between the first pixel PX1 and the second pixel PX2. Further, a center or a center line that passes through the center of the blue subpixel SB may be positioned on the boundary line between the first pixel PX1 and the second pixel PX2 for the purpose of design convenience and uniform distribution or arrangement of the subpixels. Therefore, half of the red subpixel SR and half of the blue subpixel SB, which are shared by the first pixel PX1 and the second pixel PX2, are positioned in the first pixel PX1, and the remaining half of the red subpixel SR and the remaining half of the blue subpixel SB are positioned in the second pixel PX2. Therefore, the first pixel PX1 and the second pixel PX2 are vertically symmetrical. That is, the first pixel PX1, which is one pixel, and the second pixel PX2, which is the other pixel adjacent to the first pixel PX1, are vertically symmetrical. Further, areas of the first pixel PX1 and the second pixel PX2, which are occupied by the shared red subpixel SR and the shared blue subpixel SB, may be different from each other.

In the organic light emitting display device 100 according to the example embodiment of the present disclosure, the first pixel PX1 and the second pixel PX2, which are adjacent to each other, each include the single green subpixel SG, and the first pixel PX1 and the second pixel PX2 are disposed to share the red subpixel SR and the blue subpixel SB. As a result, all of the red, green, and blue colors may be displayed by the single pixel. Unlike the organic light emitting display device in the related art in which two pixels, which each include two subpixels, are disposed in a checkerboard pattern and thus two colors are displayed by the single pixel, in the instance of the organic light emitting display device 100 illustrated in FIG. 1A, the single pixel may display three colors even though the single pixel has a light emitting area similar to that of the single pixel in the related art. For this reason, a cognitive fill factor may be improved, and an image with higher resolution may be provided.

Here, the cognitive fill factor means a proportion of a region which is actually recognized as a light emitting region in the pixel by a user who uses a display device, unlike an aperture ratio of an opening region of the subpixel. The more improved the cognitive fill factor, the larger the region actually recognized by the user, and thus the organic light emitting display device having an image with high resolution may be provided.

And, in the organic light emitting display device 100 according to the example embodiment of the present disclosure, the green subpixel SG, the blue subpixel SB, and the red subpixel SR are disposed in the single pixel, and the blue subpixel SB and the red subpixel SR are differently disposed for each column. As a result, it is possible to improve a cognitive fill factor.

And, according to the organic light emitting display device 100 according to the example embodiment of the present disclosure, the physical number of subpixels arranged in the single pixel is reduced, and as a result, it is possible to improve efficiency of the manufacturing process and emit all of the red light, the green light, and the blue light from the single pixel.

The first pixel PX1 and the second pixel PX2 constitute a repeating pixel unit GP. The organic light emitting display device 100 according to the example embodiment of the present disclosure has a structure in which the repeating pixel units GP are repeated in a particular period. In more detail, the repeating pixel units GP are continuously arranged in the column direction (Y-axis direction). That is, in the organic light emitting display device 100, the first pixels PX1 and the second pixels PX2 are alternately arranged in the column direction (Y-axis direction). In this instance, the repeating pixel units GP arranged in the column direction (Y-axis direction) are vertically symmetrical with respect to each other.

And, the repeating pixel unit GP is asymmetrical with respect to another repeating pixel unit GP adjacent to the repeating pixel unit GP in a row direction (X-axis direction). And, the repeating pixel units GP are alternately disposed so as not to be symmetrical in the row direction. That is, the repeating pixel unit GP in a first column C1 and the repeating pixel unit GP in a second column C2, which is immediately adjacent to the repeating pixel unit GP in the first column C1, are not arranged symmetrically and do not face each other side by side. In more detail, the repeating pixel unit GP in the first column C1 is arranged to be shifted downward as much as the size of the single pixel in comparison with the repeating pixel unit GP in the second column C2. Therefore, the red subpixel SR and the blue subpixel SB disposed in one repeating pixel unit GP and the red subpixel SR and the blue subpixel SB disposed in another repeating pixel unit GP, which is adjacent to one repeating pixel unit GP in the row direction (X-axis direction), are not disposed in the same line.

And, the repeating pixel units GP may be continuously arranged in the column direction, and continuously arranged in the row direction in a state of being shifted by a predetermined distance in the column direction. That is, the repeating pixel unit GP may be arranged by being shifted such that the red subpixel SR and the blue subpixel SB of the repeating pixel unit GP and the red subpixel SR and the blue subpixel SB of another repeating pixel unit GP adjacent to the repeating pixel unit GP are not positioned in the same line.

In other words, the repeating pixel units GP are arranged by being repeated once in two periods (the period herein means a cycle or a length of the repeating pixel unit) in the row direction (X-axis direction). That is, based on the repeating pixel unit GP in the first column C1, the repeating pixel unit GP in the second column C2 is shifted downward as much as the length of the single pixel compared to the repeating pixel unit GP in the first column C1, and the repeating pixel unit GP in a third column C3 is shifted upward as much as the length of the single pixel compared to the repeating pixel unit GP in the second column C2. As a result, the repeating pixel unit GP in the third column C3 and the repeating pixel unit GP in the first column C1 are positioned in the same line. The blue subpixels SB of the adjacent repeating pixel units GP are arranged in a zigzag pattern.

In the organic light emitting display device 100 according to the example embodiment of the present disclosure, the period where the subpixels become symmetrical with respect to each other is increased compared to the organic light emitting display device having a symmetrical structure in which the plurality of pixels are equally spaced apart from each other in the vertical direction or the horizontal direction or regularly and alternately arranged, or a checkerboard pattern structure in which each of the plurality of pixels are alternately arranged, thereby noticeably reducing a lattice defect. Therefore, it is possible to reduce a lattice defect and color fringe visually recognized between the subpixels by the repetitive pattern, and as a result, it is possible to improve visibility and the cognitive fill factor. In addition, referring to FIG. 1A, the subpixels in one pixel and the subpixels in another pixel adjacent to the one pixel, which constitute the organic light emitting display device 100, alternately emit light with different colors. As a result, the color fringe may be noticeably reduced in comparison with the structure in which the subpixels for emitting light with the same color are disposed in the same line.

Here, the lattice defect (artifact) refers to a defect in which a black lattice visually detected at a bank layer between the subpixels when light is emitted from the pixel, and the color fringe refers to a defect in which at an edge of a letter or a picture, colors are blurred, a single color of the RGB colors is visually detected, or in some instances, an unintended color is visually detected due to a mixture of colors.

Figure 1B:
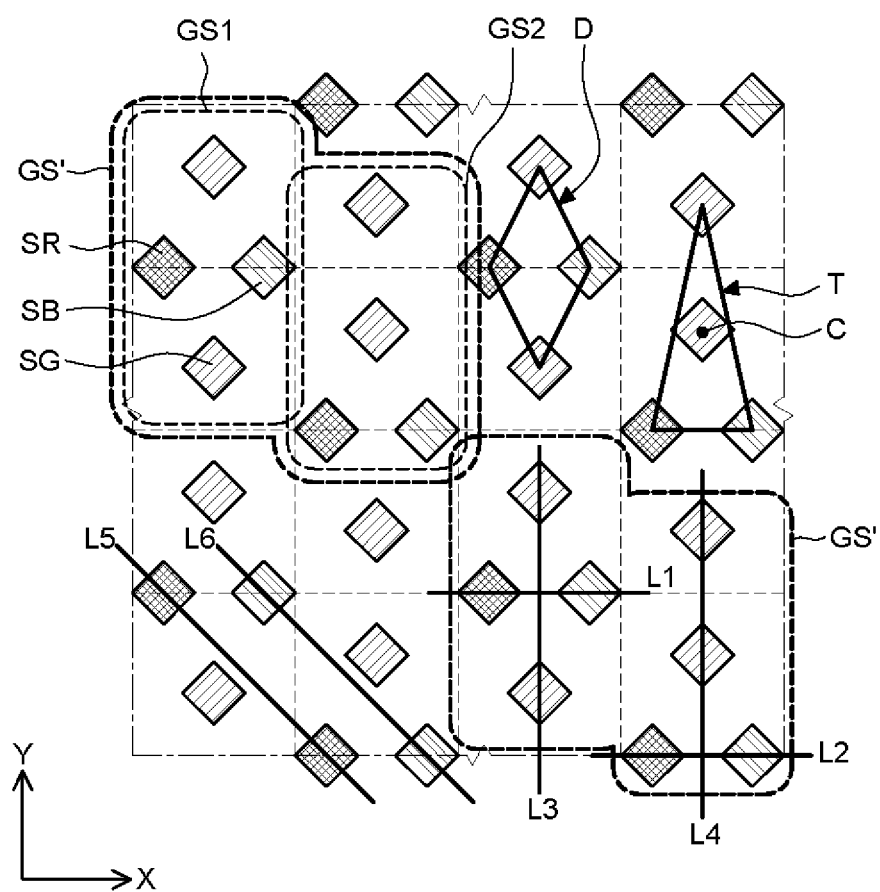

FIG. 1B is a schematic top plan view for explaining the organic light emitting display device according to the example embodiment of the present disclosure. FIG. 1B is a view separately illustrated to describe the organic light emitting display device 100 according to the example embodiment of the present disclosure in a manner different from that in which the description is made with reference to FIG. 1A. Therefore, the organic light emitting display device in FIG. 1B has the same structure as the organic light emitting display device 100 illustrated in FIG. 1A.

Referring to FIG. 1B, in the organic light emitting display device 100, subpixel groups GS' including the plurality of subpixels may be repeatedly arranged. In this instance, the subpixel group GS' includes the first subpixel unit GS1 and the second subpixel unit GS2, each of which includes a single blue subpixel, a single red subpixel, and two green subpixels.

The subpixels in the first subpixel unit GS1 are arranged to be vertically symmetrical with respect to an extended line that runs through centers of the blue subpixel and the red subpixel. In contrast, the subpixels in the second subpixel unit GS2 are configured to be asymmetrical with respect to each other. Therefore, all of the subpixels in the single subpixel group GS' are entirely asymmetrical.

In more detail, the green subpixels in the first subpixel unit GS1 are arranged to be spaced apart in different directions with respect to a first extended line L1 that runs through the centers of the blue subpixel and the red subpixel of the first subpixel unit GS1. In contrast, the two green subpixels of the second subpixel unit GS2 are arranged to be spaced apart in the same direction with respect to a second extended line L2 that runs through the centers of the blue subpixel and the red subpixel of the second subpixel unit GS2.

In this instance, a third extended line L3, which runs through the centers of the two green subpixels of the first subpixel unit GS1, is orthogonal to the first extended line L1, and a fourth extended line L4, which runs through the centers of the two green subpixels of the second subpixel unit GS2, is orthogonal to the second extended line L2. In other words, the green subpixels of the first subpixel unit GS1 are disposed to be perpendicular to the extended line that runs through the centers of the blue subpixel and the red subpixel, and the green subpixels of the second subpixel unit GS2 are disposed to be perpendicular to the extended line that runs through the centers of the blue subpixel and the red subpixel. As described above, the region of the first subpixel unit GS1 where the two green subpixels are arranged and the region of the second subpixel unit GS2 where the two green subpixels are arranged are different from each other. As a result, all of the subpixels in the single subpixel group GS' entirely have an asymmetrical shape.

In addition, a fifth extended line L5, which runs through the center of the blue subpixel of the first subpixel unit GS1 and the center of the blue subpixel of the second subpixel unit GS2, is in parallel with a sixth extended line L6 which runs through the center of the red subpixel of the first subpixel unit GS1 and the center of the red subpixel of the second subpixel unit GS2. In other words, the blue subpixels, which are arranged in the first subpixel unit GS1 and the second subpixel unit GS2, respectively, are arranged in the same direction based on the red subpixels which are arranged in the same subpixel units, respectively.

And, the single blue subpixel, the single red subpixel, and the two green subpixels, which are arranged in the first subpixel unit GS1, are arranged to be perpendicular to one another, and as a result, straight lines, which connect the centers of the subpixels, form a rhombus D or a diamond. And, straight lines, which connect a center of any one green subpixel of the two green subpixels of the second subpixel unit GS2 and centers of the single blue subpixel and the single red subpixel, form a triangle T. In this instance, a center C of the remaining green subpixel of the two green subpixels is positioned in the triangle T.

In the organic light emitting display device 100 according to the example embodiment of the present disclosure, the subpixels included in the single repeating pixel unit are asymmetrical with respect to each other and the symmetric period where the subpixels are repeated is large. As a result, it is possible to minimize a lattice defect and color fringe and improve a cognitive fill factor.

Figure 2:
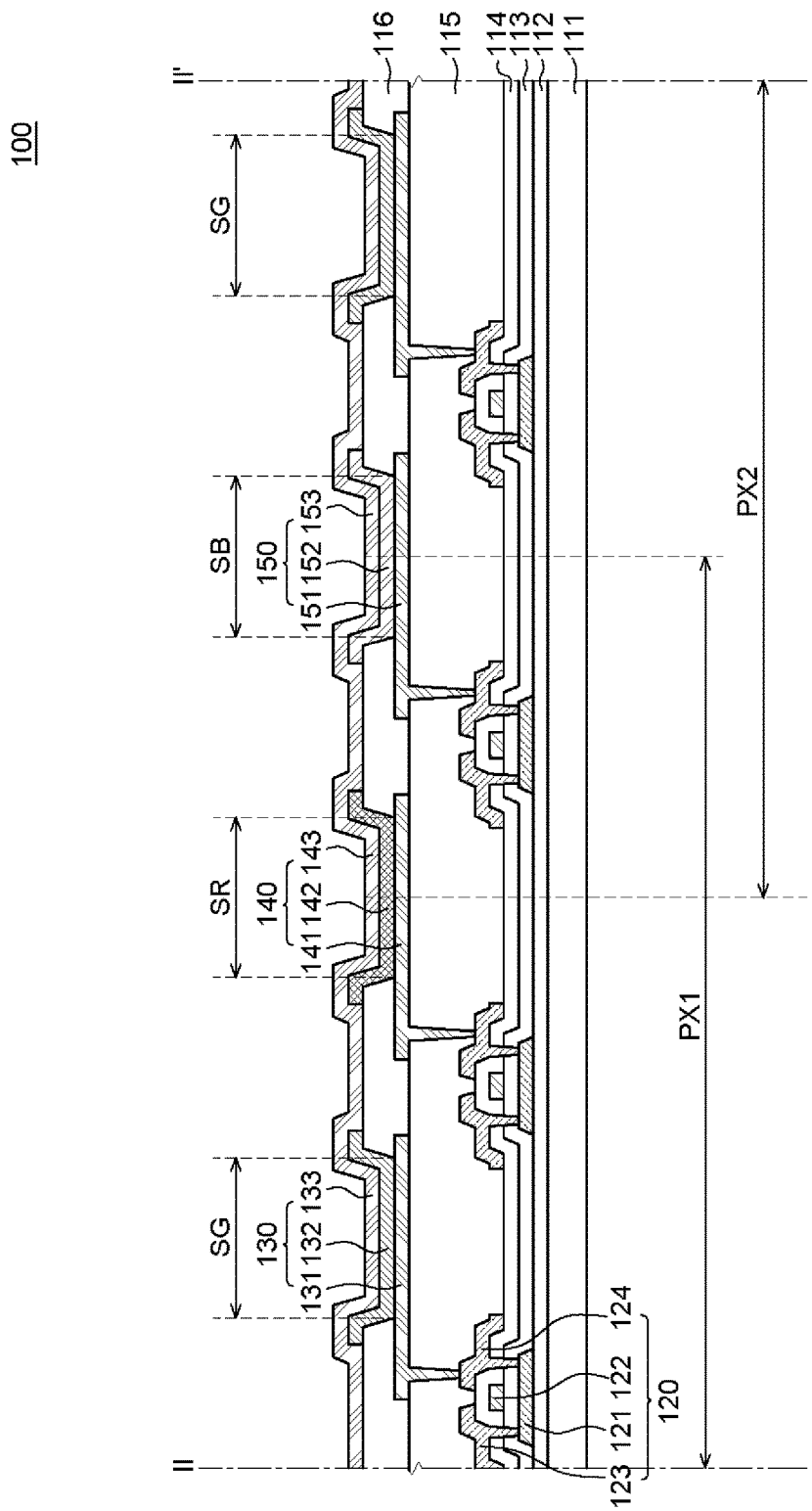
FIG. 2 is a schematic cross-sectional view taken along line II-II' of FIG. 1A, for explaining the organic light emitting display device according to the example embodiment of the present disclosure.

FIG. 2 is a schematic cross-sectional view taken along line II-II' of FIG. 1A, for explaining the organic light emitting display device 100 according to the example embodiment of the present disclosure. Referring to FIG. 2, the organic light emitting display device 100 includes the first pixel PX1 and the second pixel PX2 which include a plurality of subpixels SR, SG, and SB. The first pixel PX1 independently includes the green subpixel SG, and shares the red subpixel SR and the blue subpixel SB with the second pixel PX2. Further, the green subpixel SG, the red subpixel SR, and the blue subpixel SB each include an organic light emitting element which emits light, and a thin film transistor 120 which transmits driving voltage to the organic light emitting element. The thin film transistor 120 is provided, one for each subpixel. The organic light emitting display device 100 according to the example embodiment of the present disclosure includes two pixels PX1 and PX2, and thus includes a total of four subpixels. Since the first pixel PX1 and the second pixel PX2 share the red subpixel SR and the blue subpixel SB, it is not necessary to provide three thin film transistors for each pixel in order to emit green light, red light, and blue light. That is, the two pixels PX1 and PX2 have the four thin film transistors, and may emit all of the lights with three colors for each pixel. The aforementioned configuration may be advantageous in terms of processes and may improve process efficiency because the number of gate lines may be reduced from 6 to 4.

And, because the same thin film transistor is applied to the green subpixel SG, the red subpixel SR, and the blue subpixel SB, and substantially the same organic light emitting element is applied to the green subpixel SG, the red subpixel SR, and the blue subpixel SB except for a material that constitutes an organic light emitting layer, the description will be made based on the green subpixel SG.

A substrate 111 serves to support and protect several constituent elements of the organic light emitting display device 100. The substrate 111 may be formed of an insulating material, for example, glass or a material having flexibility such as a polyimide-based material. In an intance in which the organic light emitting display device 100 is a flexible organic light emitting display device 100, the substrate may be formed of a flexible material such as plastic. In addition, in an instance in which the organic light emitting element, which may easily implement flexibility, is applied to a lighting apparatus for a vehicle or a display device for a vehicle, the lighting apparatus for a vehicle or the display device for a vehicle or the automotive display device may be variously designed and a degree of design freedom may be ensured in accordance with a structure or an external appearance of the vehicle.

And, the organic light emitting display device 100 according to another example embodiment of the present disclosure may be applied to display devices including TVs, mobile phones, tablet PCs, monitors, laptop computers, and display devices for a vehicle or automotive display devices. Alternatively, the organic light emitting display device 100 may be applied to wearable display devices, foldable display devices, and rollable or bendable display devices.

A buffer layer 112 is disposed on the substrate 111. The buffer layer 112 inhibits moisture or impurities from penetrating through the substrate 111, and planarizes an upper portion of the substrate 111. Further, the buffer layer 112 is not a necessarily required constituent element. Whether to form the buffer layer 112 is determined based on the type of substrate 111 or the type of thin film transistor 120 applied to the organic light emitting display device 100.

The thin film transistor 120 is disposed on the buffer layer 112, and supplies a signal to a blue organic light emitting element 130. The thin film transistor 120 includes an active layer 121, a gate electrode 122, a source electrode 123, and a drain electrode 124. In detail, the active layer 121 is formed on the buffer layer 112, and a gate insulating layer 113 for insulating the active layer 121 and the gate electrode 122 is formed on the active layer 121. In addition, the gate electrode 122 is formed on the gate insulating layer 113 so as to overlap the active layer 121, and an interlayer insulating layer 114 is formed on the gate electrode 122 and the gate insulating layer 113. The source electrode 123 and the drain electrode 124 are formed on the interlayer insulating layer 114. The source electrode 123 and the drain electrode 124 are electrically connected with the active layer 121.

And, the active layer 121 may be formed of amorphous silicon (a-Si), polycrystalline silicon (poly-Si), oxide semiconductor, or organic semiconductor. In an instance in which the active layer 121 is formed of oxide semiconductor, the active layer 121 may be formed of, but not limited to, ITO (indium tin oxide), IZO (indium zinc oxide), IGZO (indium gallium zinc oxide), or ITZO (indium tin zinc oxide). In an instance in which the active layer 121 is formed of IGZO, a ratio of In:Ga:Zn may be 1:2:1. In this instance, a Ga-rich layer may be formed on an upper surface of an IGZO layer of the active layer 121. The Ga-rich layer may reduce positive bias temperature stress (PBTS), thereby improving reliability of the organic light emitting display device.

For ease of description, FIG. 2 illustrates only driving thin film transistors 120 connected with anodes 131, 141, and 151 of the organic light emitting element 130, 140, and 150, among various thin film transistors 120 that may be included in the plurality of subpixels SG, SR, and SB. However, each of the plurality of subpixels SG, SR, and SB may further include a switching thin film transistor or a capacitor for driving the organic light emitting elements 130, 140, and 150. In addition, in the present specification, the thin film transistor 120 is described as having a coplanar structure, but a thin film transistor having an inverted staggered structure may also be used. In addition, the drawing illustrates a structure in which the anodes 131, 141, and 151 of the organic light emitting elements 130, 140, and 150 of the plurality of subpixels SG, SR, and SB are connected with the drain electrodes 124 of the thin film transistors 120, respectively. However, the anodes 131, 141, and 151 of the organic light emitting elements 130, 140, and 150 may be connected with the source electrodes 123 of the thin film transistors 120 in accordance with a design.

A planarization layer 115 is disposed on the thin film transistor 120. The planarization layer 115 is a layer that planarizes the upper portion of the substrate 111, and may be formed of an organic insulating material so as to cover stepped portions of the upper portion of the substrate 111. The planarization layer 115 includes contact holes for electrically connecting the anode 131 of the green subpixel SG, an anode 141 of the red subpixel SR, and an anode 151 of the blue subpixel SB with the drain electrodes 124 of the thin film transistors 120.

The green organic light emitting element 130 is disposed on the planarization layer 115, and includes the anode 131, an organic layer 132, and a cathode 133.

The anode 131 is an electrode that supplies holes to the organic layer 132, and may be formed of a transparent conductive material having a high work function. Here, the transparent conductive material may include indium tin oxide (ITO), indium zinc oxide (IZO), and indium tin zinc oxide (ITZO). As illustrated in FIG. 2, in an instance in which the organic light emitting display device 100 is operated by a top emission method, the anode 131 may further include a reflective plate. Here, the anode 131 may be referred to as a pixel electrode.

The cathode 133 is an electrode that supplies electrons, and may be formed of a metallic material having a relatively low work function, for example, silver (Ag), titanium (Ti), aluminum (Al), molybdenum (Mo), an alloy (Ag:Mg) of silver (Ag) and magnesium (Mg), or an alloy (Mg:LiF) of magnesium (Mg) and lithium fluoride. And, the cathode 133 may be configured by at least two layers. In an instance in which the cathode 133 is formed of the alloy (Ag:Mg) of silver (Ag) and magnesium (Mg), it is possible to reduce resistance of the cathode 133 by making a silver (Ag) content higher than a magnesium (Mg) content. In this instance, to avoid a decrease in resistance caused by oxidation of silver (Ag), an ytterbium (Yb) layer may be disposed on an upper portion, a lower portion, or both of the upper and lower portions of an Ag:Mg layer. Here, the cathode 133 may be referred to as a common electrode.

An organic layer is included in each of the organic light emitting element. The organic light emitting display device 100 may have a patterned emission layer structure in accordance with a design. The organic light emitting display device having the patterned emission layer structure has a structure in which light emitting layers for emitting light with different colors are separated for each pixel. For example, a red organic light emitting layer for emitting red light, a green organic light emitting layer for emitting green light, and a blue organic light emitting layer for emitting blue light are separately configured on the red subpixel SR, the green subpixel SG, and the blue subpixel SB, respectively. In the red organic light emitting layer, the green organic light emitting layer, and the blue organic light emitting layer, the holes and the electrons, which are supplied through the anodes and the cathodes, are combined, thereby emitting light. Each of the organic light emitting layers may be patterned and deposited on each of the subpixels SR, SG, and SB through an apertured mask, for example, a fine metal mask (FMM).

The red organic light emitting layer, the green organic light emitting layer, and the blue organic light emitting layer include hosts and dopants. The host may be configured as a single host or a mixed host in which at least two hosts are mixed. In an instance in which the host is configured as a mixed host, it is possible to improve bonding between the holes and the electrons in the organic light emitting layer, and thus to increase a lifespan of the organic light emitting layer.

Further, a wavelength of light emitted from the red organic light emitting layer is in the range from 600 nm to 650 nm, and a wavelength of light emitted from the green organic light emitting layer is in the range from 510 nm to 590 nm. Further, a wavelength of light emitted from the blue organic light emitting layer is in the range from 440 nm to 480 nm.

The host is a fluorescent host, and tris(8-hydroxy-quinolinato)aluminum ($Alq_3$), 9,10-di(naphth-2-yl)anthracene (ADN), 2-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), 2,7-bis(9,9-di(4-methylphenyl)-fluorene-2-yl)-9,9-di(4-methylphenyl) (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), 2-[9,9-di(4-methylphenyl)-fluorene-2-yl]-9,9-di(4-methylphenyl)fluorene (BDAF), or 4,4'-bis(2,2-diphenyl-ethene-1-yl)-4,4'-di-(tert-butyl)phenyl (p-TDPVBi) may be used.

As a phosphorescent host, 1,3-bis(carbazole-9-yl)benzene (MCP), 1,3,5-tris(carbazole-9-yl)benzene (TCP), 4,4',4''-tris(carbazole-9-yl)triphenylamine (TcTa), 4,4'-bis(carbazole-9-yl)biphenyl (CBP), 4,4'-bis(carbazole-9-yl)-2,2'-dimethylbiphenyl (CDBP), 2,7-bis(carbazole-9-yl)-9,9-dimethylfluorene (DMFL-CBP), 4,4'-bis(carbazole-9-yl)-9,9-bis(9-phenyl-9H-carbazole)fluorene (FL-4CBP), 2,7-bis(carbazole-9-yl)-9,9-di-tolylfluorene (DPFL-CBP), or 9,9-bis[4-(carbazole-9-yl)-phenyl]fluorene (FL-2CBP) may be used. However, the host is not limited to the listed examples.

The dopant receives transition energy of the host at the organic light emitting layer and emits light having a particular wavelength. Therefore, the red organic light emitting layer, the green organic light emitting layer, and the blue organic light emitting layer may be implemented by selecting appropriate materials. As the dopant for emitting red light, there are Pt(II) octaethylpropene (PtOEP), tris[1-phenylisoquinoline]iridium (III) ($Ir(piq)_3$), 5,6,11,12-tetraphenylnaphthacene(rubrene), and 4-(dicyanomethylene)-2-tert-butyl-6-(1,1,7,7-tetramethyljulolidine-4-yl-vinyl)-4H-pyran (DCJTB). As the dopant for emitting green light, there are tris[2-phenylpyridine]iridium(III) ($Ir(ppy)_3$ (ppy=phenylpyridine), acetylacetonatebis(2-phenylpyridine)iridium(III) ($Ir(ppy)_2(acac)$), and tris[2-(p-tolyl)pyridine]iridium(III) ($Ir(mppy)_3$). As the dopant for emitting blue light, there are bis[4,6-difluorophenyl-pyridinato]iridium(III) ($F_2Irpic$), perylene, and ter-fluorene. However, the light emitting dopant is not limited to the listed examples.

In FIG. 2, a single organic layer 132, 142, or 152 is illustrated between the anode 131, 141, or 151 and the cathode 133, 143, or 153 of the green organic light emitting element 130, the red organic light emitting element 140, or the blue organic light emitting element 150. However, in addition to the organic light emitting layer, common layers such as injecting layers and transporting layers for improving light emitting efficiency of the organic light emitting element may be further disposed on the organic layers 132, 142, and 152, respectively. At least some common layers among the common layers may have a common structure in which at least some common layers are disposed in common on the plurality of subpixels in order to obtain advantages during the manufacturing process.

Here, the layers having the common structure may be formed by using a common mask in which all of the subpixels are opened, and may be stacked on all of the subpixels with the same structure without having patterns for each subpixel. That is, the layers having the common structure are disposed to be connected or extended without a disconnected portion from one subpixel to a neighboring subpixel, and thus the layers are shared by the plurality of subpixels.

For example, in addition to the organic light emitting layer, at least one organic layer, among a hole injecting layer, a hole transporting layer, an electron blocking layer, and a p-type hole transporting layer formed by doping a hole transporting layer with a p-type dopant, may be further disposed between the anode 131 and the cathode 133 of the green organic light emitting element 130 in order to more smoothly move the hole. The hole injecting layer, the hole transporting layer, the electron blocking layer, and the p-type hole transporting layer may have a common structure which is disposed in common on the plurality of subpixels. Or, at least one among an electron transporting layer, an electron injecting layer, and a hole blocking layer may be further disposed between the anode 131 and the cathode 133 of the green organic light emitting element 130 in order to more smoothly move the electron into the organic light emitting layer. The electron transporting layer, the electron injecting layer, and the hole blocking layer may have a common structure which is disposed in common on the plurality of subpixels. Or, at least one among an electron transporting layer, an electron injecting layer, and a hole blocking layer may be further disposed between the anode 131 and the cathode 133 of the green organic light emitting element 130 in order to more smoothly move the electron into the organic light emitting layer. The electron transporting layer, the electron injecting layer, and the hole blocking layer may have a common structure which is disposed in common on the plurality of subpixels.

And, the organic light emitting elements 130, 140, and 150 may be configured with one or more light emitting units. The single light emitting unit means the configuration including the anode, the organic layer, the light emitting layer, and the cathode. One or more light emitting units mean the configuration in which at least two organic layers and at least two light emitting layers are configured between the anode and the cathode, and the light emitting unit may be configured as a stack. Further, the configuration having two or more light emitting units may be configured as a tandem element. A charge generation layer is configured between one or more light emitting units, thereby adjusting supply of charges and movement of charges between the light emitting units. For example, in an instance in which there are two light emitting units, an anode, a first organic layer, a first organic light emitting layer, a charge generation layer, a second organic layer, a second organic light emitting layer, and a cathode may be provided. The first organic layer and the second organic layer may include at least one of an electron transporting layer, an electron injecting layer, and a hole blocking layer, in addition to the hole injecting layer, the hole transporting layer, the electron blocking layer, the p-type hole transporting layer, which are described above. Further, the first organic layer and the second organic layer may be disposed above or below the first organic light emitting layer and/or the second organic light emitting layer. Further, the first organic light emitting layer and the second organic light emitting layer may be layers that emit light with the same color. For example, the first organic light emitting layer and the second organic light emitting layer may be at least one among the red organic light emitting layer, the green organic light emitting layer, and the blue organic light emitting layer.

The bank layer 116 is disposed to define the subpixel. In detail, the bank layer 116 is disposed to cover at least a part of an edge of each of the anodes 131, 141, and 151, and exposes a part of an upper surface of each of the anodes 131, 141, and 151.

Figure 3:
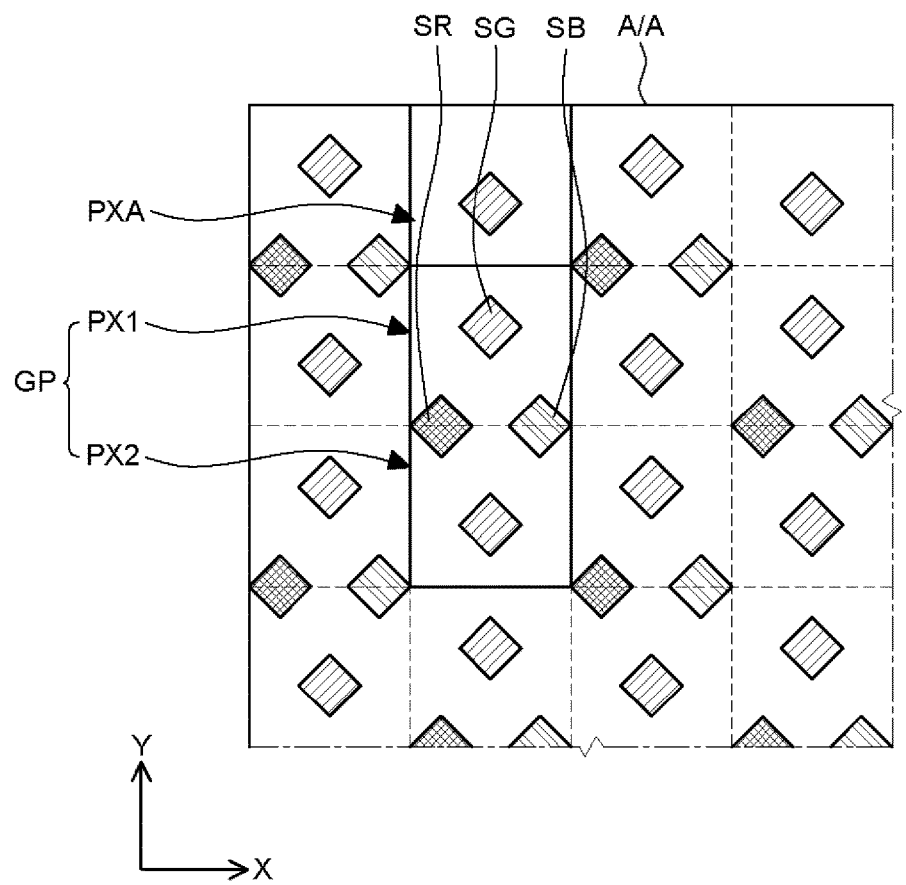
FIG. 3 is a schematic top plan view for explaining an outer periphery of an active area (A/A) of the organic light emitting display device according to the example embodiment of the present disclosure.

FIG. 3 is a schematic top plan view for explaining an outer periphery of an active area (A/A) of the organic light emitting display device 100 according to the example embodiment of the present disclosure. FIG. 3 illustrates pixels positioned on a boundary line of the active area.

Referring to FIG. 3, in the organic light emitting display device 100, the first pixel PX1 and the second pixel PX2 each include the single green subpixel SG and share the red subpixel SR and the blue subpixel SB, as illustrated in FIG. 1A. In detail, the green subpixel SG is disposed at an upper portion of the first pixel PX1, and the red subpixel SR and the blue subpixel SB, which are shared with the second pixel PX2, are disposed at a lower portion of the first pixel PX1. In addition, the red subpixel SR and the blue subpixel SB, which are shared with the first pixel PX1, are disposed at an upper portion of the second pixel PX2, and the green subpixel SG is disposed at a lower portion of the second pixel PX2. However, in the instance of a pixel PXA which is adjacent to the upper portion of the first pixel PX1 and also adjacent to the boundary line of the active area A/A, only the green subpixel SG is disposed at a lower portion of the pixel PXA, but the red subpixel SR and the blue subpixel SB are not disposed at an upper portion of the pixel PXA. That is, the red subpixel SR and the blue subpixel SB are not disposed in the pixel in which the red subpixel SR and the blue subpixel need to be disposed adjacent to the boundary line of the active area A/A. The reason is that the adjacent pixel, which shares the red subpixel SR and the blue subpixel SB together, cannot be disposed.

The organic light emitting display device 100 according to the example embodiment of the present disclosure includes the first pixel PX1 and the second pixel PX2 which are vertically adjacent to each other, and the first pixel PX1 and the second pixel PX2 include the green subpixels SG, the red subpixels SR, and the blue subpixel SB. In this instance, the red subpixel SR and the blue subpixel SB are shared by the first pixel PX1 and the second pixel PX2. The organic light emitting display device 100 according to the example embodiment of the present disclosure is configured such that the green subpixel is included in the single pixel, and the blue subpixel and the red subpixel, which are shared by the adjacent pixels, are also partially included in the single pixel. As a result, it is possible to improve a cognitive fill factor when implementing high resolution even in a state in which the pixel has the same light emitting area. In addition, in the organic light emitting display device 100 according to the example embodiment of the present disclosure, the two pixel groups, which are vertically adjacent to each other, and the pixels, which are adjacent to the left and right sides of the two pixel groups, are arranged to be asymmetrical. As a result, it is possible to minimize a lattice defect and color fringe in which a black lattice is visually detected at the bank layer between the subpixels when light is emitted from the pixel.

Figure 4:
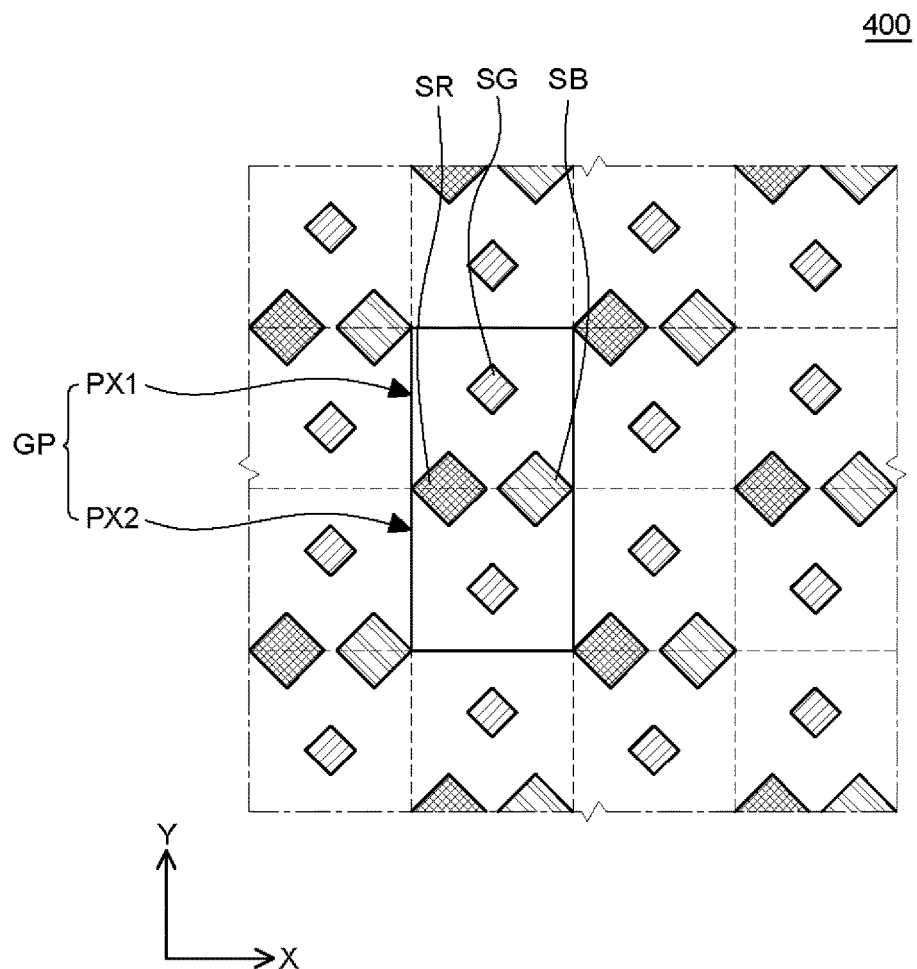
FIG. 4 is a schematic top plan view for explaining an organic light emitting display device according to another example embodiment of the present disclosure.

FIG. 4 is a schematic top plan view for explaining an organic light emitting display device 400 according to another example embodiment of the present disclosure. Because the organic light emitting display device 400 illustrated in FIG. 4 is substantially identical to the organic light emitting display device 100 illustrated in FIG. 1A except that areas of the red subpixel SR and the blue subpixel SB are different from each other, a duplicated description thereof will be omitted or will be briefly made below. In the present specification, an area of each of the subpixels is defined as an area of the light emitting region of each of the subpixels.

Referring to FIG. 4, an area of each of the shared red subpixel SR and the shared blue subpixel SB is larger than an area of each of the green subpixels SG which are disposed in the first pixel PX1 and the second pixel PX2, respectively. In general, it is known that green light having predetermined energy intensity is brighter than red light or blue light having the same energy intensity. Therefore, to obtain excellent brightness and color temperature in the single pixel, an area of the green subpixel SG may be equal to or smaller than an area of each of the red subpixel SR and the blue subpixel SB. Here, the color temperature has an effect on a color coordinate, and as a result, desired white may be implemented by obtaining a desired color temperature. Further, the area of the subpixel is not limited to the area illustrated in FIG. 4, and the area of the subpixel may be variously designed in accordance with brightness, a color temperature, and a lifespan within a range in which an area of the green subpixel SG is smaller than an area of each of the red subpixel SR and the blue subpixel SB.

Figure 5:
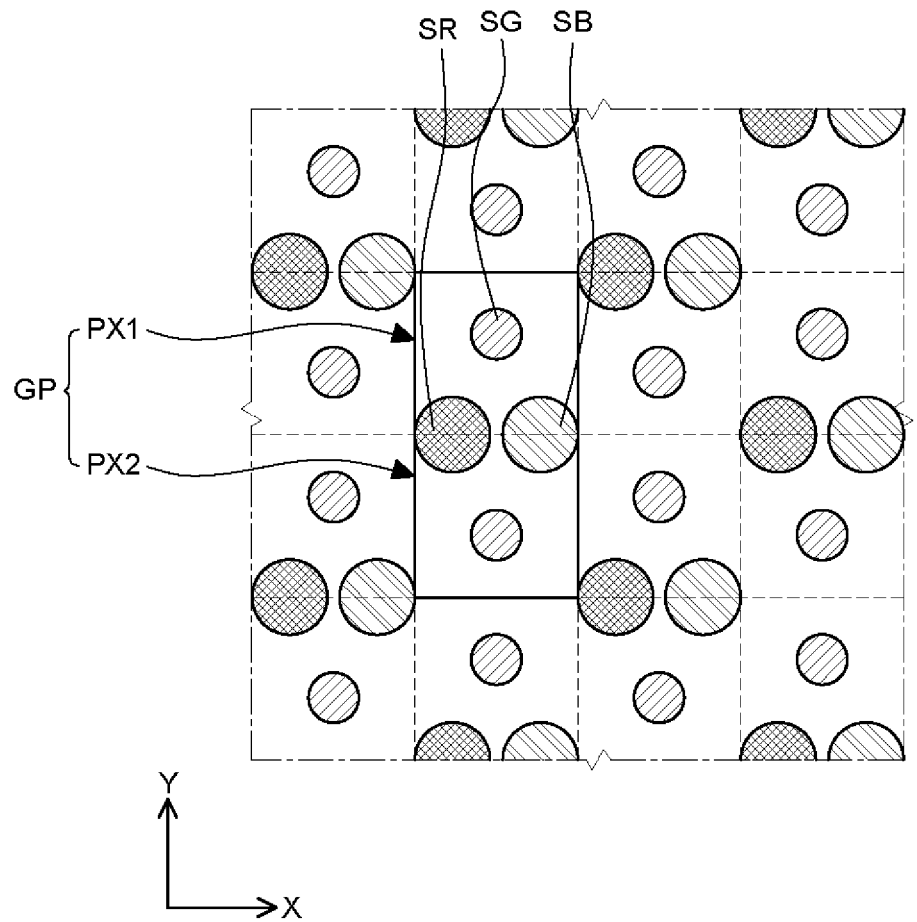
FIG. 5 is a schematic top plan view for explaining an organic light emitting display device according to another example embodiment of the present disclosure.

FIG. 5 is a schematic top plan view for explaining an organic light emitting display device 500 according to another example embodiment of the present disclosure. Because the organic light emitting display device 500 illustrated in FIG. 5 is substantially identical to the organic light emitting display device 100 illustrated in FIG. 1A except that the light emitting region of the subpixel has a circular shape, a duplicated description thereof will be omitted or will be briefly made below.

Referring to FIG. 5, the green subpixel SG, the red subpixel SR, and the blue subpixel SB are formed in a circular shape. In this instance, since the light emitting region has a circular shape, the subpixels may be more freely arranged, and the organic light emitting display device 500 having a circular display region may be implemented in addition to the organic light emitting display device 100 having a rhombus or a diamond display region. In this instance, since the shape of the subpixel, that is, the shape of the light emitting region is circular, the subpixels may be more freely arranged. In this instance, each of the subpixels has symmetry.

That is, the organic light emitting display device 500 according to another example embodiment of the present disclosure is horizontally symmetrical with respect to a straight line that runs through a center of the light emitting region. In this instance, it is possible to minimize a defect of the subpixel which may occur during a process of manufacturing the organic light emitting display device 500.

In detail, the organic light emitting layers, which constitute each of the subpixels, may be patterned and deposited by using a mask opened for each subpixel, for example, a fine metal mask (FMM). Because the FMM has a thin metal structure, the FMM may be sagged or curved by gravity during a mask deposition process. In this instance, a region on which the organic light emitting layer is deposited may be distorted, and precision of the deposition process may deteriorate. To avoid the aforementioned problem, the FMM may be pulled in a particular direction during the mask deposition process, and the pulling force may be a tensile force. In this instance, a tensile force is exerted on an opening region of the FMM, and a different tensile force is created in the opening region in accordance with a shape of the opening region of the FMM, and as a result, the shape of the opening region may be deformed. If the opening region of the FMM is deformed, the organic light emitting layer cannot be deposited at an exact position, and as a result, the subpixels may overlap each other. For this reason, a defect of the subpixel may occur. In contrast, in an instance in which the subpixel has a symmetrical shape, the same tensile force is exerted on the opening region of the FMM even though the FMM is pulled during the mask deposition process. Therefore, since the subpixels have a symmetrical shape, a tensile stress, which is applied when the FMM is pulled during the mask deposition process, may be uniformly distributed to the opening region of the FMM. Therefore, stress exerted on the FMM opening region is dispersed because of the symmetry of the opening region, and thus deformation of the opening region of the FMM may be minimized. Therefore, it is possible to minimize a defect of the subpixel which is caused when light emitting regions of the subpixels overlap each other because of a non-uniform stress applied to the opening region of the FMM, which is caused by a difference of tensile forces of the FMM that may be created during the mask deposition process. Therefore, since uniform stress is distributed to the opening region of the subpixel, deformation of the opening region of the FMM may be minimized, and precision of the process of depositing the organic light emitting layer may be improved.

And, the subpixel has a circular shape as illustrated in FIG. 5, but the subpixel may have other symmetrical shapes such as a square, a regular hexagon, and a regular octagon.

Since the subpixels of the organic light emitting display device 500 according to another example embodiment of the present disclosure have symmetry, stress exerted on the opening region of the FMM may be dispersed during the deposition process using the FMM, and deformation of the FMM may be minimized, and as a result, precision of the deposition process may be improved.

Figure 6:
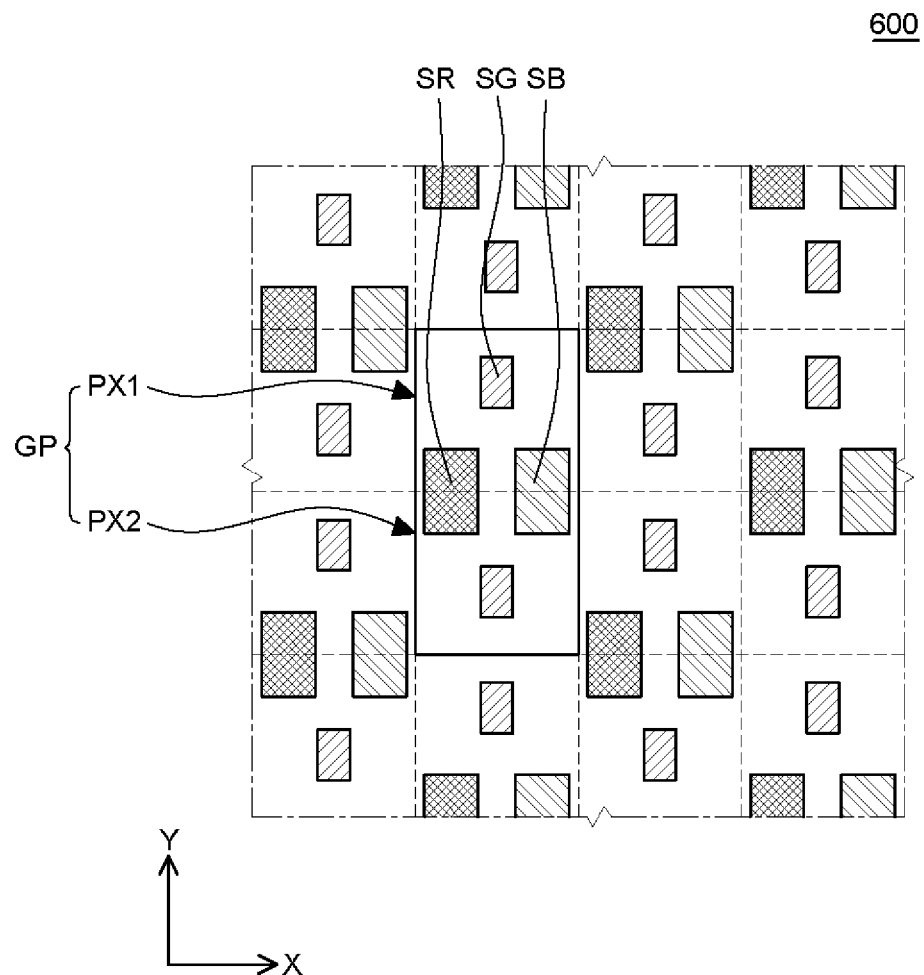
FIG. 6 is a schematic top plan view for explaining an organic light emitting display device according to an example embodiment of the present disclosure.

FIG. 6 is a schematic top plan view for explaining an organic light emitting display device 600 according to an example embodiment of the present disclosure. Because the organic light emitting display device 600 illustrated in FIG. is substantially identical to the organic light emitting display device 100 illustrated in FIG. 1A except that the light emitting region of the subpixel has a rectangular shape, a duplicated description thereof will be omitted or will be briefly made below.

Referring to FIG. 6, the green subpixel SG, the red subpixel SR, and the blue subpixel SB are formed in a rectangular shape elongated in the column direction (Y-axis direction). The subpixel having an asymmetrical shape may be formed in accordance with a size and an interval of the opening region of the FMM. In more detail, the subpixels are configured to have a shape having asymmetry, and as a result, in an instance in which an interval between the opening regions of the FMM is small, it is possible to minimize a phenomenon in which the FMM is sagged or curved by gravity during the mask deposition process.

Figure 7:
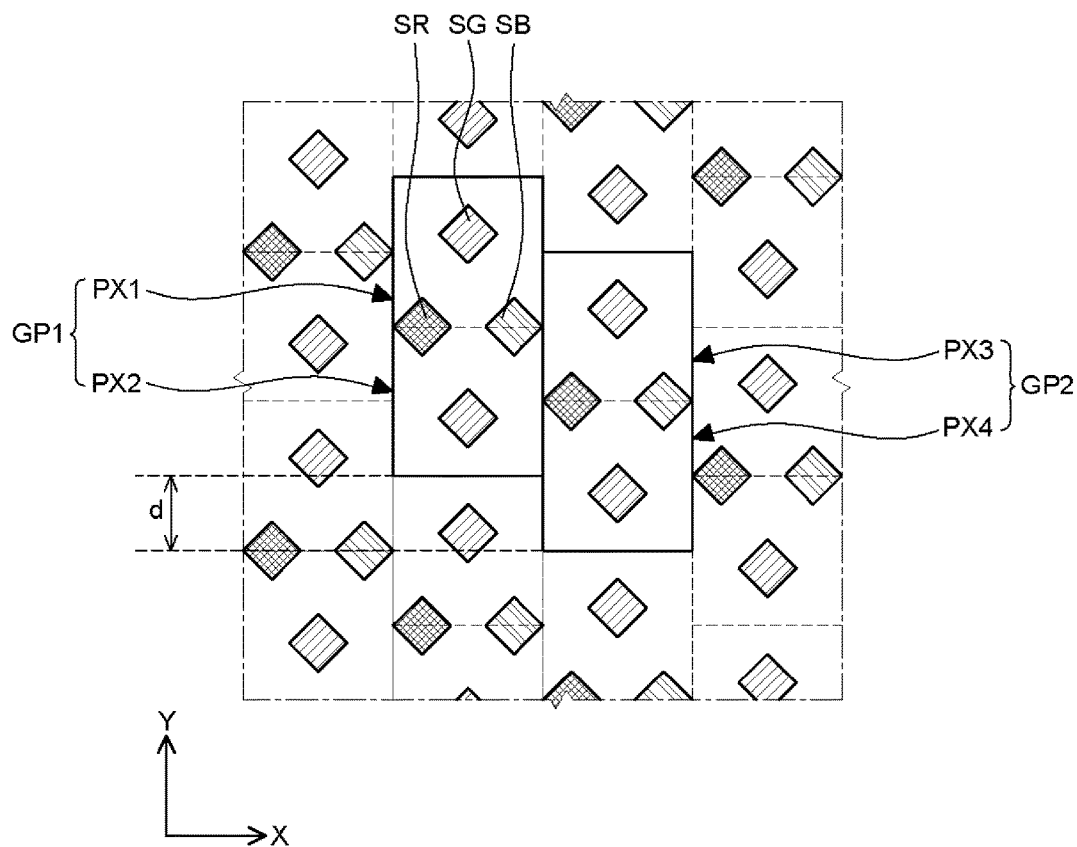
FIG. 7 is a schematic top plan view for explaining an organic light emitting display device according to another example embodiment of the present disclosure.

FIG. 7 is a schematic top plan view for explaining an organic light emitting display device 700 according to another example embodiment of the present disclosure. Because the organic light emitting display device 700 illustrated in FIG. 7 is substantially identical to the organic light emitting display device 100 illustrated in FIG. 1A except that positions of the pixels are changed, a duplicated description thereof will be omitted or will be briefly made below.

Referring to FIG. 7, the organic light emitting display device 700 includes a first repeating pixel unit GP1 including a first pixel PX1 and a second pixel PX2, and a second repeating pixel unit GP2 including a third pixel PX3 and a fourth pixel PX3. In this instance, the first repeating pixel units GP1 define a first column, and are repeatedly disposed in the column direction (Y-axis direction). The second repeating pixel units GP2 define a second column adjacent to the first column, and are repeatedly arranged in the column direction (Y-axis direction). In this instance, the second repeating pixel unit GP2 is arranged to be shifted downward by a particular distance d in comparison with the first repeating pixel unit GP1. That is, the second repeating pixel unit GP2 and the first repeating pixel unit GP1 have a phase difference with the particular distance d. In other words, the repeating pixel unit may be arranged by being shifted such that the red subpixel SR and the blue subpixel SB of the first repeating pixel unit GP1 and the red subpixel SR and the blue subpixel SB of the second repeating pixel unit GP2 adjacent to the repeating pixel unit GP1 are not positioned in the same line.

Unlike the organic light emitting display device 100 illustrated in FIG. 1A in which the second repeating pixel unit GP2 is arranged to be shifted downward as much as the distance of the single pixel in comparison with the first repeating pixel unit GP1, in the organic light emitting display device 700 illustrated in FIG. 7, the second repeating pixel unit GP2 is arranged to be shifted downward by the distance d shorter than the length of the single pixel. For example, the second repeating pixel unit GP2 is disposed to be shifted downward by half of the distance of the single pixel. In this instance, based on the first repeating pixel unit GP1 that constitutes the first column, a repeating pixel unit, which constitutes a fifth column, and the first repeating pixel unit GP1 are positioned in the same line. That is, the repeating pixel units, which constitute the organic light emitting display device 700, have a pattern in which the repeating pixel units have repeated arrangement in four periods in the row direction (X-axis direction).

In the organic light emitting display device 700 according to another example embodiment of the present disclosure, the period where the subpixels become symmetrical with respect to each other is increased, and as a result, a lattice defect and color fringe may be reduced, and a cognitive fill factor may be improved. In this instance, the distance d between the first repeating pixel unit GP1 and the second repeating pixel unit GP2 is half of the length of the single pixel, but the distance d is not limited to the half of the length of the single pixel, and may be appropriately adjusted in accordance with a design by a user.

To investigate effects of the present disclosure, an example embodiment and a comparative example, in which the subpixels are differently disposed, are evaluated by using simulations. In detail, the example embodiment has the subpixel structure illustrated in FIG. 4. In contrast, the comparative example has the subpixel structure illustrated in FIG. 8.

Figure 8:
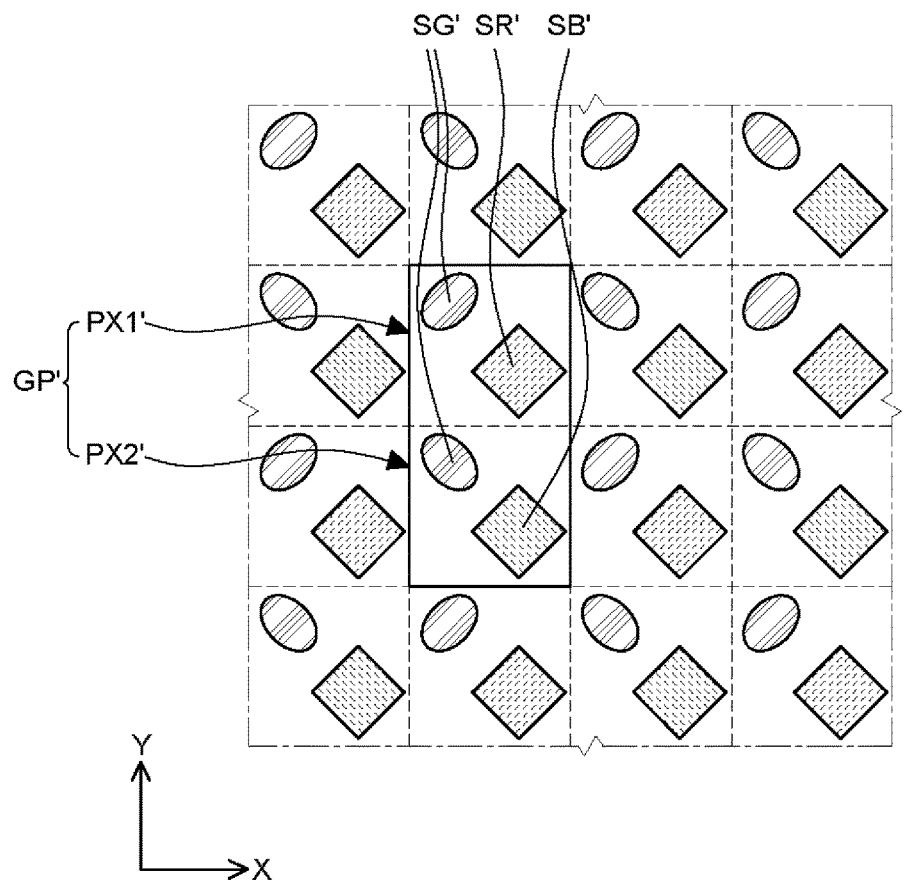
FIG. 8 is a schematic top plan view for explaining an organic light emitting display device according to a comparative example.

In this instance, FIG. 8 is a schematic top plan view for explaining an organic light emitting display device according to the comparative example. In detail, an organic light emitting display device 800 illustrated in FIG. 8 has a checkerboard pattern structure that includes first pixels PX1', each of which includes a green subpixel SG' positioned at a left upper end thereof and a red subpixel SR' positioned at a right lower end thereof, and second pixels PX2', each of which includes a green subpixel SG' positioned at a left upper end thereof and a blue subpixel SB' positioned at a right lower end thereof, in which the first pixels PX1' and the second pixels PX2' are alternately disposed. The first pixel PX1' and the second pixel PX2' constitute a repeating pixel unit GP'. In this instance, materials, sizes or the like of each of the subpixels in the example embodiment are the same as those in the comparative example. The simulation results according to the comparative example and the example embodiment are illustrated in FIGS. 9A, 9B, 10A and 10B.

Figure 9A:
FIGS. 9A and 9B are images illustrating a simulation implemented by the organic light emitting display device according to the comparative example.
Figure 9B:
Figure 10A:
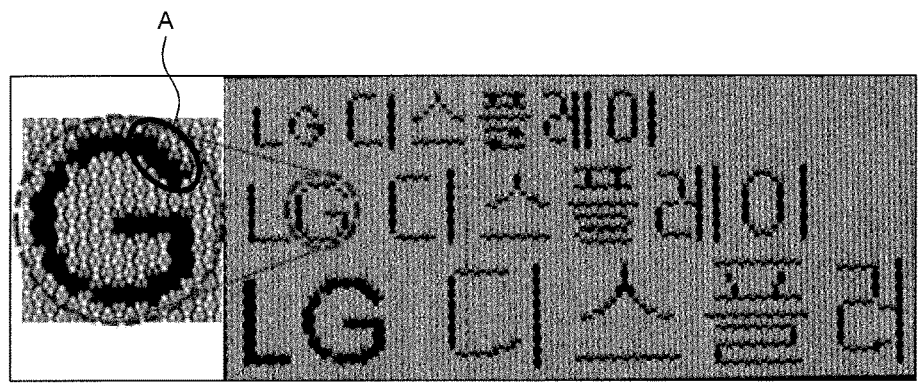
FIGS. 10A and 10B are images illustrating a simulation implemented by the organic light emitting display device according to the example embodiment of the present disclosure.
Figure 10B:
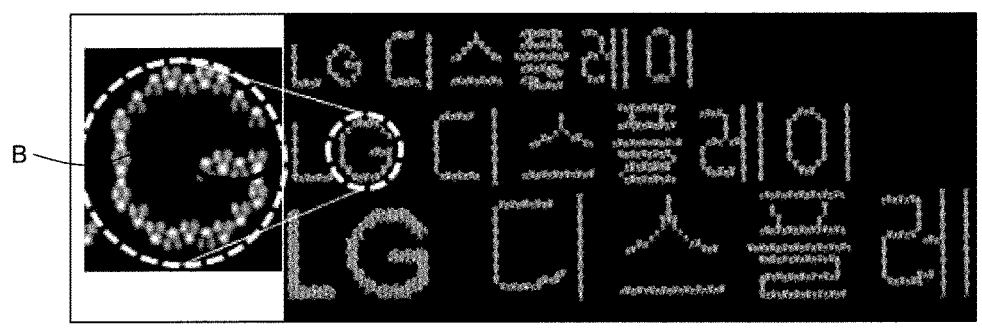

FIGS. 9A and 9B are images illustrating a simulation implemented by the organic light emitting display device according to the comparative example, and FIGS. 10A and 10B are images illustrating a simulation implemented by the organic light emitting display device according to the example embodiment of the present disclosure. FIGS. 9A and 10A are images of black letters implemented on the white background, and FIGS. 9B and 10B are images of white letters implemented on the black background.

First, referring to FIG. 9A, in region A' of the simulation implemented by the comparative example, all edge portions of letters are displayed in red, and as a result, color fringe is found which is visually detected in a single color. However, referring to FIG. 10A, in region A of the simulation implemented by the example embodiment, red and blue colors are alternately displayed in a zigzag pattern, and as a result, it can be seen that there occurs no color fringe in which an edge of a letter is shown in a single color.

In addition, referring to FIG. 9B, in region B' of the simulation implemented by the comparative example, all edge portions of letters are displayed in green, and as a result, color fringe is found which is visually detected in a single color. However, referring to FIG. 10B, in region B of the simulation implemented by the example embodiment, green, red and blue colors are displayed in a complicated pattern, and as a result, it can be seen that there occurs no color fringe in which an edge of a letter is shown in a single color.

The example embodiments of the present disclosure can also be described as follows:

According to an aspect of the present disclosure, the organic light emitting display device includes the first pixel and the second pixel. The first pixel is disposed adjacent to the second pixel, and each of the first pixel and the second pixel includes a plurality of subpixels, the plurality of subpixles include a green subpixel, a red subpixel, and a blue subpixel. In this instance, the red subpixel and the blue subpixel are shared by the first pixel and the second pixel. In the organic light emitting display device according to the example embodiment of the present disclosure, the green subpixel is included in the single pixel, and the blue subpixel and the red subpixel, which are shared by the adjacent pixels, are partially included in the single pixel. Further, two pixel groups, which are vertically adjacent to each other, are disposed such that the pixels, which are horizontally adjacent to each other, are asymmetrical. As a result, it is possible to minimize a lattice defect caused by the regular arrangement of the subpixels, and minimize color fringe in which at an edge of an image, colors are blurred or a single color of the RGB colors is visually detected.

According to one or more embodiments of the present disclosure, the first pixel and the second pixel may be vertically adjacent to each other.

According to one or more embodiments of the present disclosure, green subpixels may be included in the first pixel and the second pixel, respectively.

According to one or more embodiments of the present disclosure, an area of the green subpixel may be equal to or smaller than each of an area of the red subpixel and an area of the blue subpixel.

According to one or more embodiments of the present disclosure, the red subpixel and the blue subpixel may be equally shared by the first pixel and the second pixel.

According to one or more embodiments of the present disclosure, the first pixel and the second pixel may be symmetric relative to the shared red and blue subpixels.

According to one or more embodiments of the present disclosure, each of the red subpixel and the blue subpixel may be larger than the green subpixel.

According to one or more embodiments of the present disclosure, an area of an emission region of at least one subpixel that is shared may be the same as or greater than areas of emission regions of non-shared subpixels of the plurality of subpixels.

According to one or more embodiments of the present disclosure, emission regions of the plurality of subpixels may have one of a diamond shape, a round shape, and a rectangular shape.

According to one or more embodiments of the present disclosure, the at least one shared subpixel may have one anode electrode.

According to one or more embodiments of the present disclosure, the at least one subpixel that is shared may be disposed between the non-shared subpixels of the plurality of subpixels in thefirst pixel and the second pixel.

According to one or more embodiments of the present disclosure, the non-shared subpixels may be aligned in a vertical direction.

According to one or more embodiments of the present disclosure, the non-shared subpixels of the plurality of subpixels of the first pixel and the second pixel may be symmetric relative to a center line in a horizontal direction of the at least one subpixel that is shared.

According to one or more embodiments of the present disclosure, the first pixel and the second pixel may constitute a repeating pixel unit, and the repeating pixel unit and another repeating pixel unit adjacent to the repeating pixel unit may be asymmetrical with respect to each other.

According to one or more embodiments of the present disclosure, the repeating pixel units may be continuously arranged in a column direction, and continuously arranged in a row direction by being shifted by a predetermined distance in the column direction.

According to one or more embodiments of the present disclosure, the repeating pixel unit may be arranged by being shifted such that the red subpixel and the blue subpixel of the repeating pixel unit and the red subpixel and the blue subpixel of another adjacent repeating pixel unit are not positioned in the same line.

According to one or more embodiments of the present disclosure, the repeating pixel units may have repeated arrangement in two periods in the row direction.

According to another aspect of the present disclosure, the organic light emitting display device includes a plurality of pixels including a first pixel and a second pixel that is adjacent to the first pixel, each of the plurality of pixels including a plurality of subpixels, wherein the first pixel shares at least one of the plurality of subpixels with a first adjacent pixel, and the second pixel shares at least one of the plurality subpixels with a second adjacent pixel, and the first pixel and the second pixel are vertically symmetrical.

According to one or more embodiments of the present disclosure, an area of an emission region of the at least one subpixel that is shared may be the same as or greater than areas of emission regions of non-shared subpixels of the plurality of subpixels in each of the first pixel and the second pixel.

According to one or more embodiments of the present disclosure, emission regions of the plurality of subpixels may have one of a diamond shape, a round shape, and a rectangular shape.

According to one or more embodiments of the present disclosure, the at least one shared subpixel may have one anode electrode.

According to one or more embodiments of the present disclosure, the at least one subpixel that is shared may be disposed between the non-shared subpixels of the plurality of subpixels in the plurality of pixels.

According to one or more embodiments of the present disclosure, the non-shared subpixels may be aligned in a vertical direction.

According to one or more embodiments of the present disclosure, the non-shared subpixels of the plurality of subpixels of the first pixel and the second pixel may be symmetric relative to a center line in a horizontal direction of the at least one subpixel that is shared.

According to one or more embodiments of the present disclosure, the plurality of subpixels may include a green subpixel, a red subpixel, and a blue subpixel, and the red subpixel and the blue subpixel may be the shared subpixels.

According to one or more embodiments of the present disclosure, the first pixel and the second pixel may be vertically adjacent to each other, whereby the first adjacent pixel may be the second pixel, and the second adjacent pixel may be the first pixel, and the first pixel and the second pixel may share the same red subpixel and the same blue subpixel.

According to one or more embodiments of the present disclosure, the first pixel and the second pixel may be horizontally adjacent to each other, whereby the red subpixel and the blue subpixel may be not shared by the first pixel and the second pixel.

According to one or more embodiments of the present disclosure, the red subpixel and the blue subpixel may be arranged in the same line.

According to one or more embodiments of the present disclosure, the first pixel and the second pixel adjacent to the first pixel may constitute a repeating pixel unit, and the repeating pixel unit may have repeated arrangement in two periods.

According to one or more embodiments of the present disclosure, the repeating pixel unit may be alternately arranged so as not to be symmetrical in a row direction.

According to one or more embodiments of the present disclosure, the repeating pixel unit may include two green subpixels, a single red subpixel, and a single blue subpixel, and straight lines, which connect centers of the single blue subpixel, the single red subpixel, and the two green subpixels, may form a rhombus.

According to another aspect of the present disclosure, an organic light emitting display device comprises subpixel groups including a plurality of subpixels, the subpixel groups being repeatedly arranged. Each of the subpixel groups includes a first subpixel unit and a second subpixel unit which each include a single blue subpixel, a single red subpixel, and two green subpixels, the two green subpixels of the first subpixel unit are arranged to be spaced apart in different directions with respect to a first extended line that runs through centers of the blue subpixel and the red subpixel of the first subpixel unit, and the two green subpixels of the second subpixel unit are arranged to be spaced apart in the same direction with respect to a second extended line that runs through centers of the blue subpixel and the red subpixel of the second subpixel unit.

According to one or more embodiments of the present disclosure, the first extended line may be in parallel with the second extended line, a third extended line, which runs through centers of the two green subpixels of the first subpixel unit, may be orthogonal to the first extended line, and a fourth extended line, which runs through centers of the two green subpixels of the second subpixel unit, may be orthogonal to the second extended line.

According to one or more embodiments of the present disclosure, a fifth extended line, which runs through a center of the blue subpixel of the first subpixel unit and a center of the blue subpixel of the second subpixel unit, may be in parallel with a sixth extended line which runs through a center of the red subpixel of the first subpixel unit and a center of the red subpixel of the second subpixel unit.

According to one or more embodiments of the present disclosure, straight lines, which connects centers of the single blue subpixel, the single red subpixel, and the two green subpixels of the first subpixel unit, may form a rhombus, and a center of one green subpixel of the two green subpixels of the second subpixel unit may be positioned in a triangle formed by connecting centers of the single blue subpixel, the single red subpixel, and the other green subpixel of the two green subpixels of the second subpixel unit.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only, and not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device comprising:
a first pixel; and
a second pixel being adjacent to the first pixel,
wherein each of the first pixel and the second pixel includes a plurality of subpixels, and
wherein the first pixel and the second pixel share at least one subpixel of the plurality of subpixels,
wherein the plurality of subpixels include a green subpixel, a red subpixel, and a blue subpixel,
wherein the red subpixel and the blue subpixel are shared by the first pixel and the second pixel,
wherein the plurality of subpixels constitute subpixel groups having a first subpixel unit and a second subpixel unit which each includes the blue subpixel, the red subpixel, and two green subpixels,
wherein the first pixel and the second pixel constitute a repeating pixel unit, and
wherein the repeating pixel unit has a repeated arrangement in two periods in a row direction.

2. The organic light emitting display device of claim 1, wherein the first pixel and the second pixel are vertically adjacent to each other.

3. The organic light emitting display device of claim 1, wherein green subpixels are included in the first pixel and the second pixel, respectively.

4. The organic light emitting display device of claim 1, wherein an area of the green subpixel is equal to or smaller than each of an area of the red subpixel and an area of the blue subpixel.

5. The organic light emitting display device of claim 1, wherein the red subpixel and the blue subpixel are equally shared by the first pixel and the second pixel.

6. The organic light emitting display device of claim 1, wherein the first pixel and the second pixel are symmetric relative to the shared red and blue subpixels.

7. The organic light emitting display device of claim 1, wherein each of the red subpixel and the blue subpixel is larger than the green subpixel.

8. The organic light emitting display device of claim 1, wherein an area of an emission region of the at least one subpixel that is shared is the same as or greater than areas of emission regions of non-shared subpixels of the plurality of subpixels.

9. The organic light emitting display device of claim 8, wherein emission regions of the plurality of subpixels have one of a diamond shape, a round shape, and a rectangular shape.

10. The organic light emitting display device of claim 8, wherein the at least one shared subpixel has one anode electrode.

11. The organic light emitting display device of claim 8, wherein the at least one subpixel that is shared is disposed between the non-shared subpixels of the plurality of subpixels in the plurality of pixels.

12. The organic light emitting display device of claim 8, wherein the non-shared subpixels are aligned in a vertical direction.

13. The organic light emitting display device of claim 8, wherein the non-shared subpixels of the plurality of subpixels of the first pixel and the second pixel are symmetric relative to a center line of the at least one subpixel that is shared.

14. The organic light emitting display device of claim 1, wherein the repeating pixel unit and another repeating pixel unit adjacent to the repeating pixel unit are asymmetrical with respect to each other.

15. The organic light emitting display device of claim 14, wherein the repeating pixel units are continuously arranged in a column direction, and continuously arranged in a row direction by being shifted by a predetermined distance in the column direction.

16. The organic light emitting display device of claim 14, wherein the repeating pixel unit is arranged by being shifted such that the red subpixel and the blue subpixel of the repeating pixel unit and the red subpixel and the blue subpixel of another adjacent repeating pixel unit are not positioned in the same line.

17. The organic light emitting display device of claim 14, wherein every second column of the repeating pixel units is identical.

18. The organic light emitting display device of claim 1, wherein the red subpixel and the blue subpixel are shared by partially included in each of the first pixel and the second pixel.

19. The organic light emitting display device of claim 1, wherein straight lines which connect centers of the red subpixel, the blue subpixel, and the two green subpixels of the first subpixel unit form a rhombus.

20. The organic light emitting display device of claim 1, wherein straight lines which connect a center of one of the two green subpixels and centers of the blue subpixel and the red subpixel of the second subpixel unit form a triangle.

21. An organic light emitting display device comprising:
a first pixel; and
a second pixel being adjacent to the first pixel,
wherein each of the first pixel and the second pixel includes a plurality of subpixels, and
wherein the first pixel and the second pixel share at least one subpixel of the plurality of subpixels,
wherein the plurality of subpixels include a green subpixel, a red subpixel, and a blue subpixel,
wherein the red subpixel and the blue subpixel are shared by the first pixel and the second pixel, and
wherein the first pixel and the second pixel constitute a repeating pixel unit, and the repeating pixel unit and another repeating pixel unit adjacent to the repeating pixel unit are asymmetrical with respect to each other.

22. The organic light emitting display device of claim 21, wherein the repeating pixel units are continuously arranged in a column direction, and continuously arranged in a row direction by being shifted by a predetermined distance in the column direction.

23. The organic light emitting display device of claim 21, wherein the repeating pixel unit is arranged by being shifted such that the red subpixel and the blue subpixel of the repeating pixel unit and the red subpixel and the blue subpixel of the another repeating pixel unit are not positioned in the same line.

24. The organic light emitting display device of claim 21, wherein the repeating pixel units have repeated arrangement in two periods in a row direction.

25. The organic light emitting display device of claim 21, wherein every second column of the repeating pixel units is identical.

\* \* \* \* \*